(12) United States Patent
Mangat et al.

(10) Patent No.: US 6,297,169 B1
(45) Date of Patent: Oct. 2, 2001

(54) METHOD FOR FORMING A SEMICONDUCTOR DEVICE USING A MASK HAVING A SELF-ASSEMBLED MONOLAYER

(75) Inventors: Pawitter J. S. Mangat, Chandler, AZ (US); C. Joseph Mogab, Austin, TX (US); Kevin D. Cummings, Phoenix; Allison M. Fisher, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/122,710

(22) Filed: Jul. 27, 1998

(51) Int. Cl.[7] .............................. H01L 21/312; G03F 9/00
(52) U.S. Cl. ................................ 438/736; 430/5; 378/35; 438/942; 438/945; 438/725; 438/717; 438/689
(58) Field of Search ..................................... 438/780, 782, 438/942, 945, 736, 717, 689, 725; 430/5, 296; 250/492.2, 492.23; 378/35

(56) References Cited

U.S. PATENT DOCUMENTS

| | | | | |
|---|---|---|---|---|
| Re. 36,964 | * | 11/2000 | Berger | 430/296 |
| 4,448,865 | * | 5/1984 | Bohlen | 430/5 |
| 4,515,876 | * | 5/1985 | Yoshihara | 430/5 |
| 4,735,890 | * | 4/1988 | Nakane | 430/311 |
| 4,802,951 | * | 2/1989 | Clark | 156/630 |
| 4,939,052 | * | 7/1990 | Nakagawa | 430/5 |
| 4,981,771 | * | 1/1991 | Mochiji | 430/322 |
| 5,196,283 | * | 3/1993 | Ikeda | 430/5 |
| 5,318,687 | * | 6/1994 | Estes | 430/23 |
| 5,464,711 | | 11/1995 | Mogab et al. | 430/5 |
| 5,510,230 | * | 4/1996 | Tennant | 430/325 |
| 5,773,177 | * | 6/1998 | Ikeda | 430/5 |
| 5,866,913 | * | 2/1999 | Robinson | 250/492.22 |
| 5,885,753 | * | 3/1999 | Crooks | 430/325 |
| 5,942,760 | * | 8/1999 | Thompson | 250/492.2 |
| 6,118,577 | * | 9/2000 | Sweatt | 359/351 |
| 6,124,063 | * | 9/2000 | Dauksher | 430/5 |
| 6,140,020 | * | 10/2000 | Cunnings | 430/296 |
| 6,180,239 | * | 1/2001 | Whitesides | 428/411.1 |
| 6,187,482 | * | 2/2001 | Kuroda | 430/5 |

OTHER PUBLICATIONS

Ulman, "Formation and Structure of Self–Assembled Monolayers," American Chemical Society, Chemical Reviews, vol. 96, No. 4, pp. 1533–1554 (1996).

Ulman, "An Introduction of Ultrathin Organic Films: From Langmuir–Blodgett to Self–Assembly," Self–Assembled Monolayers, Part Three, pp. 237–304 (1991).

* cited by examiner

*Primary Examiner*—Mary Wilczewski
*Assistant Examiner*—David J Goodwin
(74) *Attorney, Agent, or Firm*—Robert A. Rodriguez

(57) ABSTRACT

A passivating layer (220) is formed overlying portions of a mask (200). The mask (200) is used to pattern a semiconductor device substrate (62). In accordance with one embodiment of the present invention, the passivating layer (220) is removed prior to patterning the semiconductor device substrate (62). In yet another embodiment, the passivating layer (220) is cleaned prior to patterning the semiconductor device substrate (62) and then left to remain overlying portions of the mask (200) during the patterning process.

21 Claims, 3 Drawing Sheets

METHOD FOR FORMING A SEMICONDUCTOR DEVICE USING A MASK HAVING A SELF-ASSEMBLED MONOLAYER

RELATED APPLICATIONS

This is related to U.S. patent application No. 08/963,325 filed Nov. 3, 1997, which is assigned to the current assignee hereof and is hereby incorporated by reference.

FIELD OF THE INVENTION

The present invention relates generally to semiconductor manufacturing, and more particularly to forming a semiconductor device with a lithographic mask.

BACKGROUND OF THE INVENTION

One goal of semiconductor fabrication is to increase the density of active elements provided on an integrated circuit. In order to accomplish this, ongoing investigation in advanced lithography is underway to decrease the critical dimensions of active elements used to form these integrated circuits. Current lithography uses energy sources that include i-line at 365 nanometers and deep ultra-violet (DUV) at 248 nanometers to pattern substrate features. Decreasing the wavelength of the energy source allows for the formation of photoresist features having smaller critical dimensions.

Accordingly, smaller wavelength energy sources are being developed as alternatives to conventional lithography. These include x-ray, ion projection, extreme ultra-violet (EUV) at 13.4 nanometers, and scattering with angular limited projection in electron-beam lithography (SCALPEL).

SCALPEL and x-ray lithography masks are formed of attenuating elements overlying thin membranes. The membrane thickness of a SCALPEL mask is typically in range of 100–150 nanometers and the membrane thickness of an x-ray ray mask is typically in a range of 2000–5000 nanometers. Cleaning such masks is relatively difficult and presents numerous problems. Conventional wet chemical processes do not adequately remove particles without reacting with or damaging the mask. Physical agitation, such as ultrasonic agitation, is generally undesirable because of the delicate nature of the membranes. Other cleaning techniques, such as dry laser cleaning and frozen ice cleaning, are likely to be ineffective at adequately cleaning the masks, particularly when attempting to remove particles between patterned mask features.

Conventional lithography has adopted the use of pellicles to protect masks from particles and to prevent the imaging of defects onto the semiconductor substrate. However, the use of pellicles in SCALPEL and x-ray lithography is problematic. The pellicle increases the thickness of material through which the energy must pass, thereby reducing throughput and increasing chromatic aberration. Additionally, contaminants or particles deposited on pellicles used in SCALPEL and x-ray lithography may nevertheless be imaged onto the resist, unlike in conventional lithography.

Development in the field of self-assembled monolayers (SAMs) has been underway for several years. The particularities of commonly formed SAMs are disclosed in technical literature, including "Formation and Structure of Self-Assembled Monolayers", by Abraham Ulman, Chemical Reviews, Vol 96, 4, (1996) 1532–1544, and "An Introduction to Ultrathin Organic Films: From Langmuir-Blodgett to Self-Assembly" by Abraham Ulman, Academic Press, Inc., Boston (1991) 237–304, both of which are hereby incorporated by reference.

BRIEF DESCRIPTION OF THE DRAWINGS

The present invention is illustrated by way of example and not limitation in the accompanying figures, in which like references indicate similar elements, and in which.

Figure 1:
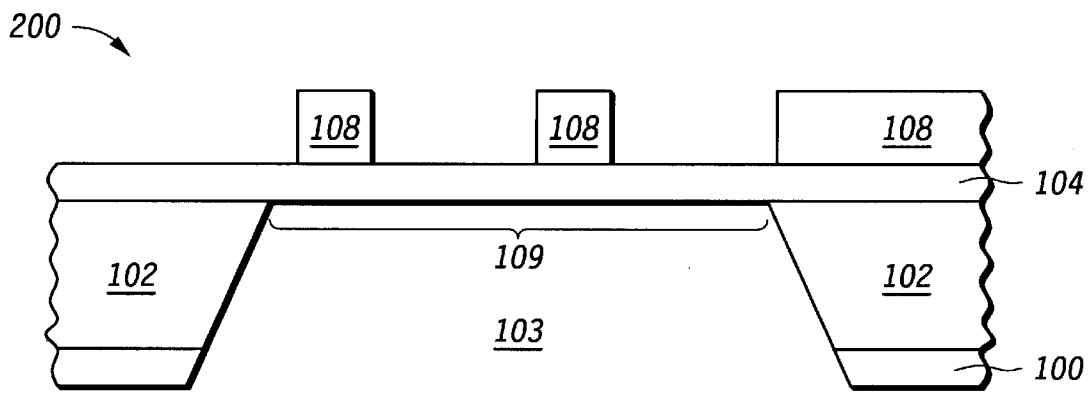
FIG. 1 includes an illustration of a cross section of a mask used for SCALPEL processing.

It will be appreciated that for simplicity and clarity of illustration, elements illustrated in the figures have not necessarily been drawn to scale. For example, the dimensions of some of the elements in the figures are exaggerated relative to other elements to help to improve understanding of embodiment(s) of the present invention. Further, where considered appropriate, reference numerals have been repeated among the figures to indicate corresponding or analogous elements.

DETAILED DESCRIPTION

Embodiments of the present invention discuss the use masks having membranes and attenuating elements and a method of using these masks for forming semiconductor devices. Examples of attenuating elements include the scattering elements used in SCALPEL and the attenuating elements used in x-ray lithography. In accordance with embodiments of the present invention, a passivating layer is formed overlying portions of the mask, and the mask is used to pattern features on a semiconductor device substrate.

FIG. 1 illustrates an embodiment of the present invention and includes a mask 200 used for performing SCALPEL processing. Included in FIG. 1 are a substrate 102, a bottom layer 100, a membrane layer 104, and scattering elements 108. Substrate 102 is generally formed of monocrystalline silicon, but may also be formed of other materials. Substrate 102 is processed using low pressure chemical vapor deposition (LPCVD) processing to form a bottom layer 100 underlying a secondary surface of the substrate 102, and a membrane layer 104 overlying a primary surface of the substrate 102. In one embodiment, layers 100 and 104 are silicon nitride. Alternatively, layers 100 and 104 may be formed of other materials, using other CVD techniques, as determined by those of ordinary skill in the art. Typically, the membrane layer is formed using elements having atomic numbers less than approximately 20.

A scattering layer is formed overlying the membrane layer 104. Typically, the scattering layer is formed using elements having an atomic number greater than approximately 72, such as tungsten, titanium, tantalum, tungsten silicide, titanium silicide, tantalum silicide, gold, and the like. The scattering layer is patterned and etched using a conventional etch process to form the scattering elements 108, as illustrated in FIG. 1. The bottom layer 100 is patterned and etched using a conventional nitride etch process to form an opening 103 in bottom layer 100. Portions of the substrate 102 are then removed to define a window portion 109. Functional portions of a representative SCALPEL mask are illustrated by the structure shown in FIG. 1.

Figure 2:
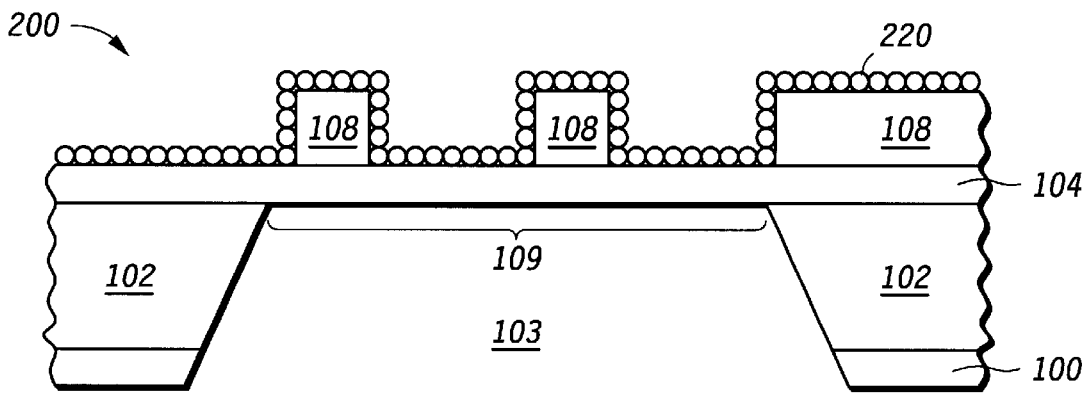
FIG. 2 illustrates the mask of FIG. 1 and further includes the formation of a self-assembled monolayer overlying portions of the mask.

In accordance with an embodiment of the present invention, FIG. 2 further illustrates the mask in FIG. 1, and now includes a self-assembled monolayer (SAM) 220 formed overlying the patterned scattering layer 108 and the membrane layer 104. The term monolayer herein refers to a film having an thickness approximately equal to a length of a single atom or molecule. The SAM 220 is typically a thin 1–5 nanometer organic layer that is adsorbed onto the surfaces of the membrane layer 104 and scattering layer 108. It generally has a structure that includes three portions, (1) a surface active head group that interacts with the surface of the mask, (2) an intermediate group that forms the chain of the molecule, and (3) an air-monolayer interface group that stabilizes the SAM 220.

SAM formation results from a molecular-substrate interaction in which the head group of the molecule is pinned to specific sites on the substrate surface via a chemical bond. In the case of a alkyltrichlorosilanes on hydroxylated or oxidized surfaces, a covalent Si—O bond is formed. After the molecules have been put in place on the surface of the substrate, the formation of orderly and closely packed alkyl chains begins, which is the intermediate portion of the molecule. The Van der Waals interactions between the alkyl chains are the main attractive forces in the case of the intermediate portions of the molecule. The third molecular component is the terminal functionality, which in the case of a simple alkyl chain is a methyl (CH3) group.

In accordance with embodiments of the present invention, the entire surface of the mask is coated with a SAM. This may be accomplished in the presence of a native or a thermally grown oxide so as to provide appropriate nucleation sites for the SAM. In one embodiment, the outermost surface of the mask has an oxide component, either a native oxide or a purposely formed oxide, such as a thermal oxide or the like. Accordingly, the membrane layer 104, which is formed of silicon nitride, has a thin outer layer of silicon dioxide, and the scattering layer 108, which is formed of tantalum, has a thin outer layer of tantalum oxide. As noted above, the scattering layer may be formed of other materials, such as tantalum, tantalum silicide, tungsten, tungsten silicide, etc. The oxide layers are in a range of approximately 1–4 nanometers thick and provide an appropriate interface to which the SAM 220 adsorbs.

In one embodiment, the surface active head group of the SAM 220 is an organosilicon derivative. Additionally, the surface active head group of the SAM 220 may be any molecule that has been shown to self-assemble into a monolayer on a surface, including organic carboxylic and hydroxamic acids, organosulfur materials, organoselenium materials, alkyl materials, organophosphate materials, organoamine materials, organo-germanium materials, organosulphonate materials, and the like. Within the group of organosilicon derivatives, alkylchlorosilanes, alkylalkoxysilanes, alkylaminosilanes, and the like may be used to form self-assembled monolayers on the mask.

In a typical procedure, the substrate is placed into a solution of 10 (mM) millimolar octadecyltrichlorosilane (ODT) at room temperature (20° C.) for 1.5 hours (The 10 mM solution of ODT is prepared by dissolving 0.39 milliliter of ODT in 100 milliliter of an anhydrous aprotic solvent, such as hexadecane, immediately prior to use). After approximately 1.5 hours, the substrate is rinsed with hexane, ethanol, distilled water, and finally dried in a stream of nitrogen. During adsorption, the silicon component of the octadecyltrichlorosilane reacts with the oxidized surface to form a network of Si—O—Si bonds. The result is a self-assembled monolayer (SAM) in which the molecules are connected both to each other and to the substrate surface by chemical bonds.

FIG. 2 includes an illustration of the previously described self-assembled monolayer (SAM) 220 overlying the membrane 104 and the scattering layer 108. The self-assembled monolayer 220 is formed using a spin-on technique. Alternatively, the SAM 220 may be formed using an immersion, a solution deposition, a vapor deposition, or a micro-contact printing technique. The SAM is formed overlying the mask such that the transmission of the electron beam (e.g., 75–150 KeV) through the mask is relatively unobstructed. This is accomplished using self-assembled monolayers having low atomic number elements (less than approximately 20), such as silicon, carbon, oxygen, and the like, and thicknesses of less than approximately 10 nanometers. Typically, the thickness of the SAM is in a range of approximately 1.5–6.0 nanometers. In accordance with embodiments of the present invention, the SAM 220 is formed of a material that has an electron scattering power that is less than that of the scattering layer 108, due to differences in the atomic weight of the respective materials. The SAM 220 also has an electron scattering power that may be the same or different than that of the membrane layer 104.

Figure 3:
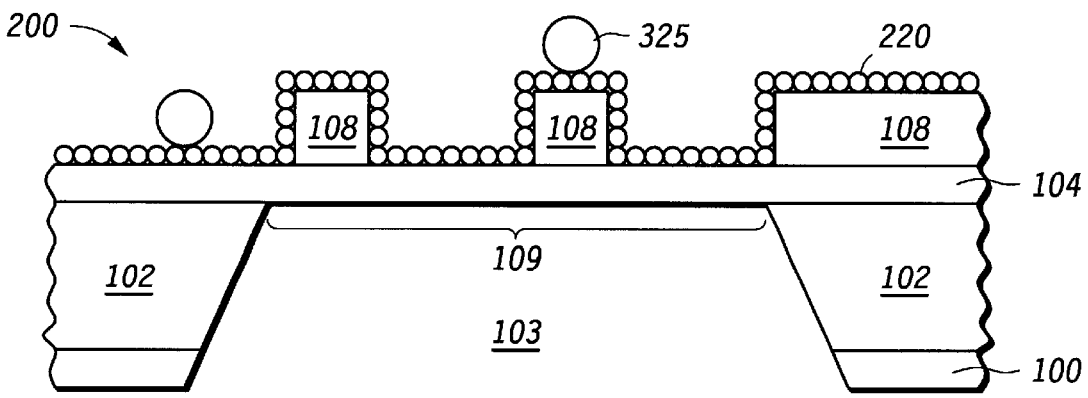
FIG. 3 illustrates the mask of FIG. 2 and further includes defects overlying the mask and on the self-assembled monolayer.

FIG. 3 illustrates the embodiment shown in FIG. 2, after repeated use, such that defects 325 (particles) are present on the mask. As previously discussed, these defects are highly undesirable and should be removed. According to embodiments of the present invention, the defects 325 may be removed using various techniques. In one embodiment, the particles are removed from the SAM 220 using a dry cleaning process that leaves the SAM 220 intact. Examples of these include a dry laser cleaning process, a frozen ice cleaning process, or the like. In this embodiment, dry cleaning effectively removes the defects 325 because there is a weaker attractive force or bond between the defects 325 and the SAM 220 or between the terminal and intermediate portions of the SAM, as compared to the force of attraction that would otherwise be present between the defects 325 and the membrane 108 (i.e., an unprotected mask). As an additional benefit, the SAM 220 may be a buffer layer during cleaning and thus prevent damage to the scattering layer 108 and the membrane 104.

The SAM 220 may not always present on the mask while the mask is being used to expose the substrate. In some cases, it may be desirable to remove the particles 325 and the SAM 220 prior to using the mask. The removal can done using either a plasma, a wet chemical, or a thermal process. In the case of a plasma process, an oxygen-containing plasma is used to remove the SAM 220. In the case of a wet chemical processes, an acidic solution may be used to dissolve the SAM 220. For example, in the case of the organosilicon SAM 220 above, the SAM 220 and particles 325 can be removed using a solution of sulfuric acid and hydrogen peroxide (piranha). After the defects and SAM 220 have been removed, the mask is dried using conventional drying techniques and is then ready for use, storage, or reapplication of the SAM 220. In each case however, the mask is free of particles as a result of performing the cleaning operation.

Figure 4:
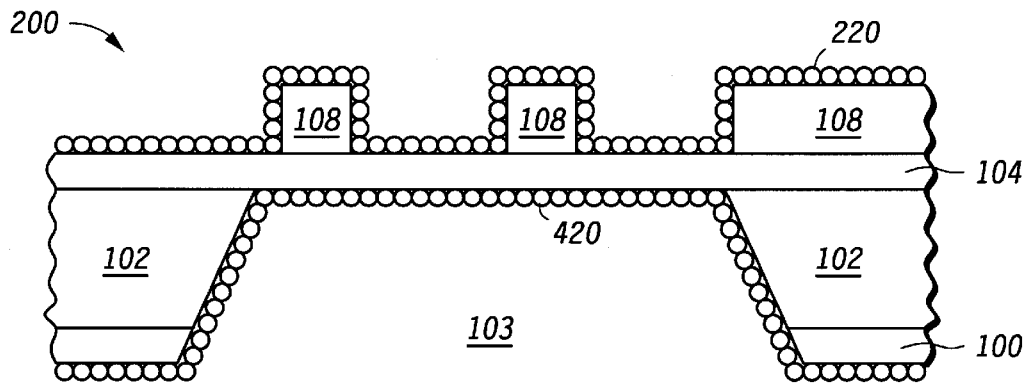
FIG. 4 illustrates the mask of FIG. 2 and further includes a self-assembled monolayer formed overlying top and bottom portions of the mask.

FIG. 4 includes another embodiment illustrating the formation of a SAM overlying the mask. In this embodiment, the self-assembled monolayer is formed overlying both the top and bottom surfaces of the mask 200. The SAM 220 is formed on the top surface of the mask overlying the scattering layer and membrane layer, and a SAM 420 is formed on a bottom surface of the mask underlying portions of the bottom layer 100, the substrate 102, and the membrane layer 104. This is accomplished using the immersion technique referenced previously. The presence of the SAM overlying portions of the bottom side of the mask facilitates its cleaning, and in some cases, may prevent damage from occurring to bottom portions of the mask 200.

Figure 5:
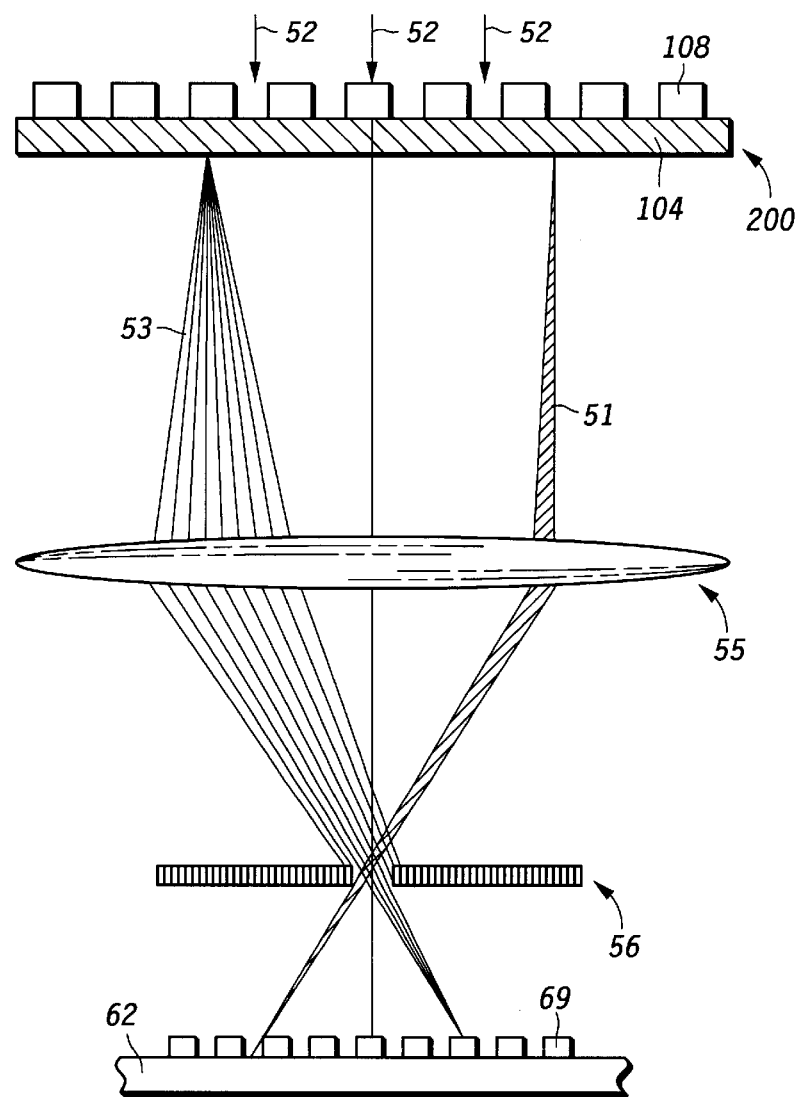
FIG. 5 includes an illustration of a cross-sectional view of a SCALPEL system during an exposure processing step.

In accordance with embodiments of the present invention, the SAM covered mask is used in a projection E-beam lithography tool 50 as illustrated in FIG. 5. Electron beams (radiation), as illustrated with arrows 52, are directed toward the mask 200. The mask includes the membrane 104, scattering elements 108, and SAM 220 (not shown) as previously described in FIG. 2. The radiation 52 passes relatively unobstructed through portions of the mask comprising the membranes 104 and the SAM 220 as illustrated by the unscattered electron beam 51. In areas of the mask where scattering elements are present, the radiation 52 is scattered as illustrated by scattered electron beam 53. The electron beams 51 and 53 are then focused by lens 55 and pass through aperture 56 before reaching the semiconductor device substrate 62. The unscattered electron beam 51 passes through the aperture 56 relatively unobstructed to expose the resist layer 69 coated over the semiconductor substrate 62. Only a relatively small portion of the scattered electron beam 53 passes through the aperture 56. This small portion is incapable of substantially exposing the resist layer 69. This results in the formation of high-contrast images on a semiconductor device substrate 62.

Figure 6:
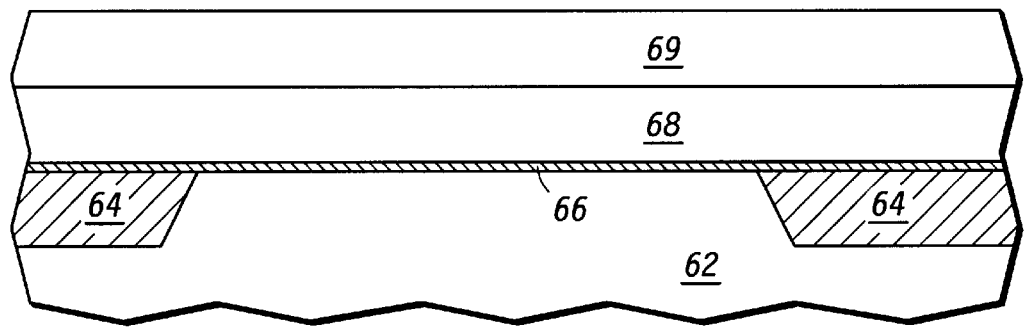
FIG. 6 includes an illustration of a cross-sectional view of a portion of a semiconductor device substrate prior to performing a SCALPEL exposure processing step.
Figure 7:
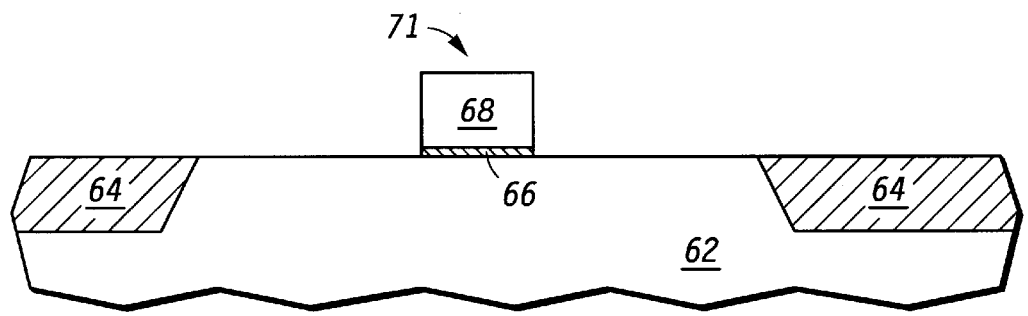
FIG. 7 includes an illustration of a cross-sectional view of the substrate of FIG. 6 after performing a SCALPEL patterning processing step.
Figure 8:
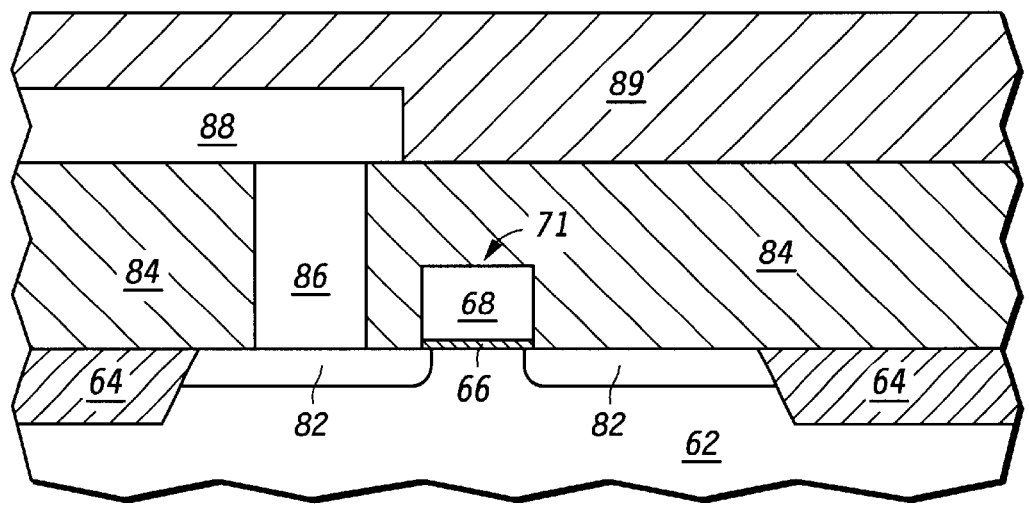
FIG. 8 includes an illustration of a cross-sectional view of the substrate of FIG. 7 after forming a substantially completed device.

FIGS. 6–8 further illustrate the manufacture of a semiconductor device substrate using a scattering with angular limited projection in electron-beam lithography (SCALPEL) mask. FIG. 6 illustrates a partially completed semiconductor device 59 and includes a substrate 62 with field isolation regions 64. Further included in FIG. 6 are a gate dielectric layer 66, a conductive layer 68, and a photoresist layer 69 overlying the substrate 62. FIG. 7 shows the partially completed semiconductor device after forming a gate electrode 71 from the conductive layer 68 using the system illustrated in FIG. 5.

The processing of substrate 62 continues until a substantially completed semiconductor device 80 is formed as shown in FIG. 8. The semiconductor device 80 now includes doped regions 82, an interlevel dielectric layer 84, a contact plug 86, an interconnect 88, and a passivation layer 89.

Using embodiments of the present invention, many problems associated with the prior art are overcome. For example, the manufacturability of devices with smaller features is improved because the likelihood of printing defects from the SCALPEL mask onto the substrate is reduced. The use of a SAM facilitates the removal of the particles from the mask. Removal of particles prior to patterning the semiconductor device substrate reduces the likelihood of imaging the defects from the mask onto the semiconductor device substrate during the exposure process. Additionally, SAMs provide the mask with protection during cleaning and allow for effective mask cleaning using milder cleaning conditions. Therefore, the cleaning process is less likely to undesirably etch, corrode, or damage surfaces of the mask, including the scattering layer and the membrane layer.

The mask described above may alternatively be used in x-ray lithographic processes. In this case, the scattering elements are replaced by absorbing elements. In both cases, the scattering elements and the absorbing elements overlie a membrane layer less than approximately 10 microns thick and form a medium used to define patterned resist features on the semiconductor device substrate. In both cases, the SAM may be used to facilitate the cleaning of the mask to remove particles and contaminants.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Further advantages and benefits of specific embodiments should not be construed to apply to those particular embodiments, and any particular advantage or benefit should not be construed as an essential element for any or all the claims. In the claims, means-plus-function clause(s), if any, cover the structures described herein that perform the recited function(s). Benefits and advantages tied to embodiments are not requirements of the claims. Problems and solutions to embodiments and any solution to a problem is not necessarily a requirement or essential feature or element.

What is claimed is:

1. A method of forming a semiconductor device comprising:

placing a semiconductor device substrate into a lithography tool having a mask, wherein the mask includes a mask substrate, a membrane layer and attenuating elements, and wherein a passivating layer, which is further characterized as a self-assembled monolayer, is formed overlying portions of the membrane layer and attenuating elements;

patterning resist features on the semiconductor device substrate using the mask;

removing the semiconductor device substrate from the lithography tool after patterning; and processing the semiconductor device substrate to form the semiconductor device.

2. The method of claim 1, wherein a thickness of the membrane layer is less than approximately 10 microns.

3. The method of claim 2, wherein the membrane layer includes silicon.

4. The method of claim 2, wherein the membrane layer includes elements having atomic numbers less than approximately 20.

5. The method of claim 2, wherein the attenuating elements include tantalum.

6. The method of claim 2, wherein the attenuating elements include atoms having atomic numbers greater than approximately 72.

7. The method of claim 1, wherein the mask includes a SCALPEL mask.

8. The method of claim 1, wherein forming the passivating layer includes using an immersion technique.

9. The method of claim 1, wherein forming the passivating layer includes using a method selected from a group consisting of solution deposition, vapor deposition, spin-on, and micro-contact printing.

10. The method of claim 1, wherein the passivating layer includes an organosilicon derivative.

11. The method of claim 10, wherein the organosilicon derivative is selected from a group consisting of alkylchlorosilanes, alkylalkoxysilanes, and alkylaminosilanes.

12. The method of claim 1, wherein the passivating layer includes octadecyltrichlorosilane.

13. The method of claim 1, wherein the passivating layer is selected from a group consisting of an organic carboxylic acid, an organic hydroxamic acid, an organoselenium material, an organosulfur material, an alkyl material, an organophosphate material, an organoamine material, an organo-germanium material, and an organosulphonate material.

14. The method of claim 1, wherein a passivating layer thickness is in a range of approximately 1.5–6.0 nanometers.

15. The method of claim 1, wherein a passivating layer thickness is less than approximately 10 nanometers.

16. The method of claim 1, further comprising:

removing the passivating layer after patterning; and redepositing a new passivating layer prior to performing a future patterning process.

17. The method of claim 1 further comprising:

removing the passivating layer prior to patterning; and redepositing a new passivating layer after patterning.

18. The method of claim 1, wherein the passivating layer is cleaned prior to patterning.

19. The method of claim 1, wherein the passivating layer includes elements having atomic numbers less than approximately 20.

20. The method of claim 1, wherein the passivating layer further comprises a first passivating layer formed overlying a top surface of the mask, and a second passivating layer formed underlying a bottom surface of the mask.

21. The method of claim 1, wherein the mask includes an x-ray mask.

* * * * *